(12) United States Patent
Harada et al.

(10) Patent No.: US 12,090,670 B2
(45) Date of Patent: Sep. 17, 2024

(54) TRANSFER ROBOT AND ROBOT SYSTEM

(71) Applicant: KABUSHIKI KAISHA YASKAWA DENKI, Kitakyushu (JP)

(72) Inventors: Osamu Harada, Kitakyushu (JP); Toshiyuki Harada, Kitakyushu (JP); Kentaro Yotsuji, Kitakyushu (JP)

(73) Assignee: KABUSHIKI KAISHA YASKAWA DENKI, Kitakyushu (JP)

( * ) Notice: Subject to any disclaimer, the term of this patent is extended or adjusted under 35 U.S.C. 154(b) by 402 days.

(21) Appl. No.: 17/475,350

(22) Filed: Sep. 15, 2021

(65) Prior Publication Data

US 2022/0001541 A1    Jan. 6, 2022

Related U.S. Application Data

(63) Continuation of application No. 16/435,565, filed on Jun. 10, 2019, now Pat. No. 11,167,419.

(30) Foreign Application Priority Data

Jul. 13, 2018  (JP) ................................ 2018-133294

(51) Int. Cl.
*B25J 9/16*    (2006.01)
*B25J 9/00*    (2006.01)
(Continued)

(52) U.S. Cl.
CPC .......... *B25J 9/1682* (2013.01); *B25J 9/0087* (2013.01); *B25J 9/009* (2013.01); *B25J 9/06* (2013.01);
(Continued)

(58) Field of Classification Search
CPC . B25J 9/043; B25J 18/04; B25J 9/1682; B25J 9/087; B25J 9/009; B25J 9/06; B25J 9/042; B25J 9/126
See application file for complete search history.

(56) References Cited

U.S. PATENT DOCUMENTS 6,485,250 B2 *  11/2002  Hofmeister ................ B25J 9/06
                                              414/744.1
9,076,830 B2 *   7/2015  Kremerman ...... H01L 21/67742
(Continued)

FOREIGN PATENT DOCUMENTS

JP     S61-293791     12/1986
JP     S63-016985      1/1988
(Continued)

OTHER PUBLICATIONS

Office Action with Form PTO-892 Notice of References Cited issued by the United States Patent and Trademark Office for the co-pending U.S. Appl. No. 16/435,565, May 27, 2021.
(Continued)

*Primary Examiner* — Jake Cook
(74) *Attorney, Agent, or Firm* — MORI & WARD, LLP

(57) ABSTRACT

A transfer robot includes one arm, another arm, a motor, and a brake. The another arm is connected to the one arm via a shaft such that the another arm is rotatable relatively with respect to the one arm around a shaft axis of the shaft. The motor includes a rotor rotatable around the shaft axis to rotate the another arm around the shaft axis, and a stator connected to the one arm. The brake is provided at the another arm to apply a force to the stator so as to suppress relative rotation between the stator and the rotor when electric power is not supplied to the motor.

29 Claims, 9 Drawing Sheets

(51) Int. Cl.
  *B25J 9/06* (2006.01)
  *B25J 18/04* (2006.01)
  *H01L 21/677* (2006.01)
  *H01L 21/687* (2006.01)

(52) U.S. Cl.
  CPC ........ *B25J 18/04* (2013.01); *H01L 21/67742* (2013.01); *H01L 21/68707* (2013.01)

(56) References Cited

U.S. PATENT DOCUMENTS

| | | | |
|---|---|---|---|
| 2005/0011294 A1 | 1/2005 | Hashimoto et al. | |
| 2005/0115352 A1* | 6/2005 | Tanaka | G03F 7/70766 74/490.03 |
| 2008/0067966 A1 | 3/2008 | Ou et al. | |
| 2011/0262257 A1 | 10/2011 | Hino | |
| 2013/0115028 A1 | 5/2013 | Kremerman et al. | |
| 2013/0195599 A1 | 8/2013 | Furuichi et al. | |
| 2013/0195600 A1 | 8/2013 | Furuichi et al. | |
| 2014/0379128 A1 | 12/2014 | Ishikawa et al. | |
| 2015/0258693 A1 | 9/2015 | Yazawa et al. | |
| 2016/0036301 A1 | 2/2016 | Tominaga et al. | |
| 2019/0263007 A1 | 8/2019 | Cui et al. | |

FOREIGN PATENT DOCUMENTS

| | | |
|---|---|---|
| JP | H03-256690 | 11/1991 |
| JP | 2002-134585 | 5/2002 |
| JP | 2005-39047 | 2/2005 |
| JP | 4473075 B2 | 3/2006 |
| JP | 2008-036762 | 2/2008 |
| JP | 2011-224743 | 11/2011 |
| KR | 10-2016-0040312 | 4/2016 |

OTHER PUBLICATIONS

Office Action issued by the United States Patent and Trademark Office for the co-pending U.S. Appl. No. 16/435,565, Sep. 8, 2021.
Japanese Office Action for corresponding JP Application No. 2018-133294, Nov. 24, 2021 (w/ English machine translation).
Korean Office Action for corresponding KR Application No. 10-2019-0046061, Mar. 28, 2022 (w/ English machine translation).
Japanese Office Action for corresponding JP Application No. 2022-082032, Mar. 7, 2023 (w/ English machine translation).
Chinese Office Action for corresponding CN Application No. 201910434225.0, Nov. 28, 2023 (w/ English machine translation).

* cited by examiner

TRANSFER ROBOT AND ROBOT SYSTEM

CROSS-REFERENCE TO RELATED APPLICATIONS

The present application is a continuation application of the U.S. patent application Ser. No. 16/435,565, filed Jun. 10, 2019, which claims priority under 35 U. S. C. § 119 to Japanese Patent Application No. 2018-133294, filed Jul. 13, 2018. The contents of these applications are incorporated herein by reference in their entirety.

BACKGROUND

Technical Field

An embodiment disclosed herein relate to a transfer robot and a robot system.

Related Art

Conventionally, a transfer robot such as a horizontal articulated robot that transfers an object to be transferred is known. Further, Japanese Patent Application Laid-Open No. 2005-039047 describes a substrate transfer robot that transfers a substrate as an object to be transferred and incorporates a motor of a finished product in an arm.

SUMMARY

According to one aspect of the present invention, a transfer robot includes one arm, another arm, a motor, and a brake. The another arm is connected to the one arm via a shaft such that the another arm is rotatable relatively with respect to the one arm around a shaft axis of the shaft. The motor includes a rotor rotatable around the shaft axis to rotate the another arm around the shaft axis, and a stator connected to the one arm. The brake is provided at the another arm to apply a force to the stator so as to suppress relative rotation between the stator and the rotor when electric power is not supplied to the motor.

According to another aspect of the present invention, a transfer robot includes one arm having a first connection portion, another arm, and a motor. The another arm has a second connection portion that is connected to the first connection portion of the one arm via a shaft such that the another arm is rotatable relatively with respect to the one arm around a shaft axis of the shaft. The motor is provided at the first connection portion of the one arm. The motor includes a rotor rotatable around the shaft axis to rotate the another arm around the shaft axis, and a stator connected to the first connection portion of the one arm. The first connection portion of the one arm projects toward the another arm and has a thickness larger than a thickness of a portion other than the first connection portion of the one arm. The another arm has another portion which projects toward the one arm and which has a thickness larger than a thickness of the second connection portion of the another arm.

According to further aspect of the present invention, a transfer robot includes one arm, another arm, a motor, and a lift portion. The another arm is connected to the one arm via a shaft such that the another arm is rotatable relatively with respect to the one arm around a shaft axis of the shaft. The motor includes a rotor rotatable around the shaft axis to rotate the another arm around the shaft axis, and a stator connected to the one arm. The lift portion is configured to raise and lower the one arm and the another arm and includes a built-in motor integrated with the lift portion. The built-in motor is configured to rotate the one arm.

According to the other aspect of the present invention, a transfer robot includes one arm, another arm, and a motor. The another arm is connected to the one arm via a shaft such that the another arm is rotatable relatively with respect to the one arm around a shaft axis of the shaft. The motor is provided at the one arm and includes a rotor rotatable around the shaft axis to rotate the another arm around the shaft axis. The shaft includes a first shaft portion and a second shaft portion. The first shaft portion is fixed to the one arm and has an axis coaxial with the shaft axis. The second shaft portion is fixed to the another arm and is connected to the first shaft portion via a bearing such that the second shaft portion is rotatable around the shaft axis relatively with respect to the first shaft portion.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings.

DETAILED DESCRIPTION

Figure 1:
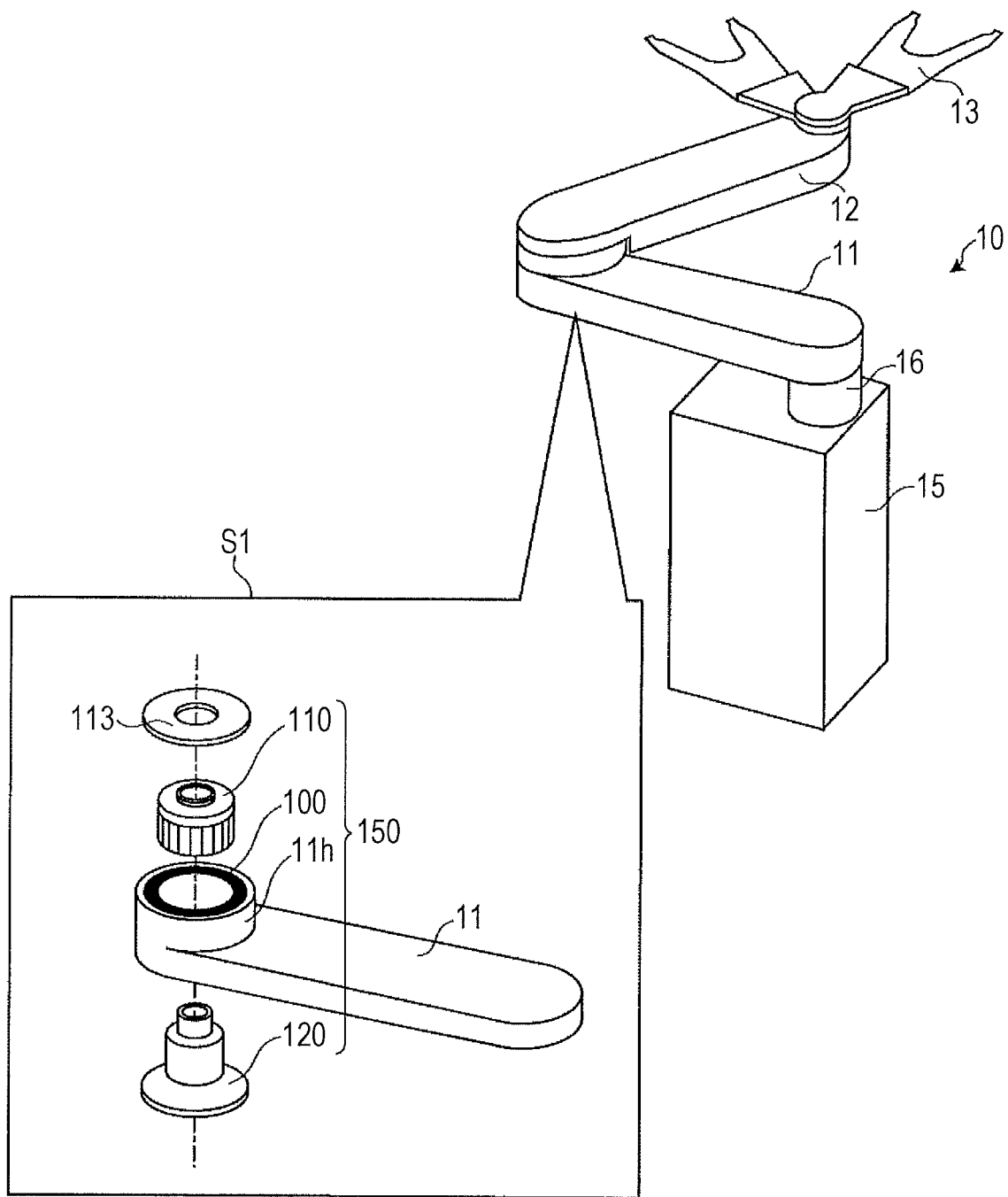
FIG. 1 is a schematic view showing an outline of a transfer robot.

The embodiments will now be described with reference to the accompanying drawings, wherein like reference numerals designate corresponding or identical elements throughout the various drawings.

A transfer robot and a robot system disclosed in the present application will be described in detail below, with reference to the accompanying drawings. Herein, this invention is not limited to the embodiment described below.

In the embodiment described below, although expressions such as "parallel", "center", "symmetry", "reverse direction", and "cylinder" may be used, it is not necessary to strictly meet these states. That is, each expression mentioned above shall accept deviations, such as manufacture accuracy, installation accuracy, processing accuracy, and detection accuracy.

First, an outline of a transfer robot 10 according to the embodiment will be described with reference to FIG. 1. FIG. 1 is a schematic view showing the outline of the transfer robot 10. FIG. 1 is a perspective view of the transfer robot 10 viewed obliquely from above and an exploded perspective view of a first arm 11 (see S1 of FIG. 1).

As shown in FIG. 1, the transfer robot 10 includes a main body 15 installed on a floor surface and the like and a lift portion 16 rising and lowering with respect to the main body 15. The lift portion 16 raises and lowers the first arm 11 and a second arm 12 which are horizontal link arms. A hand 13 is provided on the tip end side of the second arm 12. The hand 13 can hold an object to be transferred such as a substrate for semiconductor.

Although two hands 13 are shown in FIG. 1, one or three or more hands 13 may be provided. Although the two arms (the first arm 11 and the second arm 12) are shown as horizontal link arms in FIG. 1, three or more horizontal link arms may be provided.

Here, the transfer robot 10 includes an arm-integrated built-in motor 150 as shown in S1 of FIG. 1. FIG. 1 exemplifies a case where the first arm 11 includes the built-in motor 150 which causes the second arm 12 to pivot.

Specifically, the built-in motor 150 includes a stator holding portion 11h formed in the arm and a stator portion (a stator) 100 held by the stator holding portion 11h. The built-in motor 150 further includes a base 120 and a rotor portion (a rotor) 110 supported by the base 120 and rotated relative to the base 120.

Here, the stator portion 100 and the base 120, which are components that do not rotate relative to the stator holding portion 11h, may be collectively referred to as the stator portion 100. That is, among the components of the built-in motor 150, the components that do not rotate relative to the stator holding portion 11h may be collectively referred to as the "stator portion 100", and the components that rotate relative to the stator holding portion 11h may be collectively referred to as the "rotor portion 110".

Thus, when the component that does not rotate is referred to as the stator portion 100 and the component that rotates is referred to as the rotor portion 110, it can be said that the built-in motor 150 has a shape in which the rotor portion 110 is embedded in a recess between a non-rotating shaft (shaft portion 122) and a magnetic field generating portion (motor core 100a and motor winding 100b) in the stator portion 100. That is, the rotor portion 110 is embedded in a hollow region within the thickness of the stator portion 100, so that the built-in motor 150 achieves a reduction in height of the motor.

An attachment portion 113 which rotates together with the rotor portion 110 serves as a lid that covers an opening on the second arm 12 side in the stator holding portion 11h. The base 120 serves as a lid that covers an opening on the opposite side to the second arm 12 in the stator holding portion 11h. The second arm 12 is attached to the attachment portion 113.

As shown in S1 of FIG. 1, the stator portion 100, the rotor portion 110, and the base 120 are accommodated in the stator holding portion 11h. That is, the built-in motor 150 uses the stator holding portion 11h formed in the first arm 11 instead of a case for accommodating the stator portion 100, the rotor portion 110 and the base 120.

As described above, since the transfer robot 10 includes the arm-integrated built-in motor 150, the arm can be miniaturized as compared with the configuration in which a so-called finished motor having a case is used. This makes it possible to contribute to thinning of the arm and narrowing of the width of the arm.

The built-in motor 150 does not have a built-in reduction gear and an external reduction gear. Therefore, the built-in motor 150 can directly cause the arm (the second arm 12 in FIG. 1) to pivot. For this reason, as compared with the configuration in which a reduction gear is used, vibration, an operation error, and a mechanical loss can be suppressed.

Hereinafter, the configuration of the built-in motor 150 will be described in more detail with reference to FIG. 2.

Figure 2:
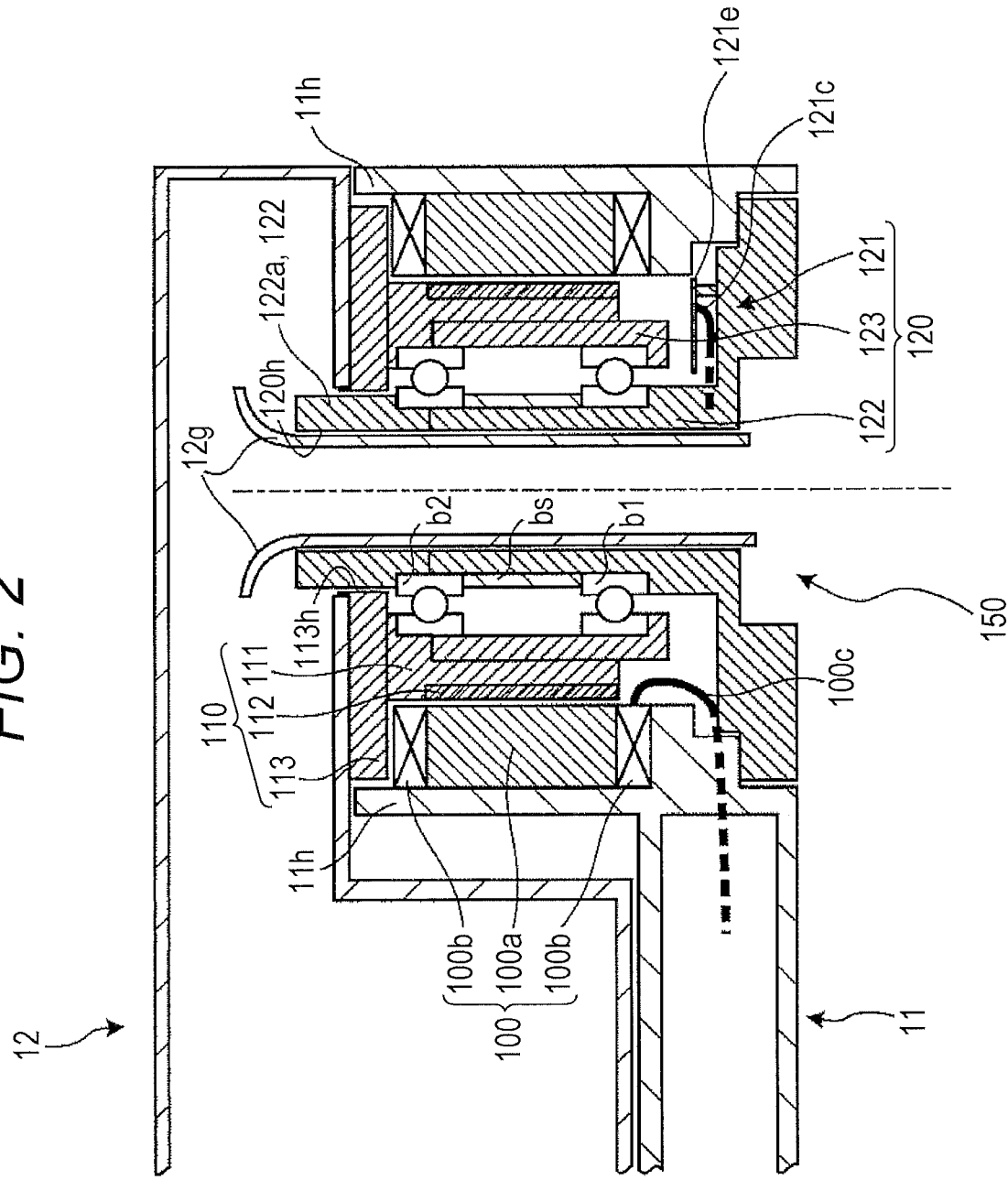
FIG. 2 is a cross-sectional view of a built-in motor.

FIG. 2 is a cross-sectional view of the built-in motor 150. FIG. 2 shows a cross-sectional view cut along a plane including the axis of rotation of the second arm (the axis of rotation of the built-in motor 150) and along the extending direction of the first arm 11.

As shown in FIG. 2, the stator holding portion 11h formed at an end of the first arm 11 has a substantially cylindrical shape that protrudes to the upper surface side of the first arm, and the stator portion 100 is fitted to the inner periphery by so-called shrink fitting or the like. For example, when the stator portion 100 at normal temperature is inserted into the heated stator holding portion 11h, the stator holding portion 11h contracts in a cooling process to hold the stator portion 100. The stator portion 100 may be fixed to the stator holding portion 11h with an adhesive. Alternatively, the stator portion 100 may be fixed to the stator holding portion 11h by inserting a pin or the like radially from the outer peripheral side of the stator holding portion 11h toward the motor core 100a of the stator portion 100.

First, the stator portion 100 will be described. The stator portion 100 is integrally solidified by molding, for example, the motor core 100a on which a silicon steel plate is stacked and the motor winding 100b wound around teeth of the motor core 100a with a resin or the like and is formed into a cylindrical shape. The motor winding 100b generates a magnetic field by energization. The motor winding 100b may be wound around a plurality of bobbins made of resin or the like, and the bobbins may be attached to the teeth. The motor core 100a may have a coreless shape without teeth (inner core), and in the stator portion 100, the motor winding 100b may be molded on an inner periphery of an outer core.

The stator portion 100 has a cylindrical shape, and has the outer peripheral side in contact with the stator holding portion 11h and the inner peripheral side facing the outer peripheral side of the rotor portion 110 at an interval. That is, in the built-in motor 150, the stator portion 110 normally accommodated in the case is accommodated in the stator holding portion 11h of the first arm 11.

A winding cable 100c for energizing the motor winding 100b is guided to a proximal end of the first arm 11 via an internal space (an internal space below the stator holding portion 11 in FIG. 2) which does not interfere with the rotor portion 110 on the inner peripheral side of the stator portion 100. Although the winding cable 100c is accessible from below the first arm 11, this point will be described later with reference to FIG. 6.

Next, the rotor portion 110 will be described. The rotor portion 110 has a cylindrical shape and includes a cylindrical shaft portion 111 corresponding to a yoke and a magnet 112 fixed to the outer peripheral side of the shaft portion 111 with an adhesive or the like. Each of the magnets 112 has, for example, a rectangular shape in which the direction along the axis of rotation of the rotor portion 110 is longitudinal and the direction along the outer periphery is lateral, and the magnets 112 are spread across the entire outer periphery of the shaft portion 111 at predetermined intervals.

On the other hand, the inner peripheral side of the shaft portion 111 is fixed to the outer peripheral side of the rotating portion 123 in the base 120. That is, the rotor portion 110 rotates around a rotation centerline of the rotating portion 123. Here, the rotation centerline of the rotating portion 123 corresponds to the axis of rotation of the second arm 12 described above.

The attachment portion 113 having a through hole 113h is fixed to an end surface of the shaft portion 111 on the second arm 12 side (upper end surface in FIG. 2). Here, the attachment portion 113 is used to fix the second arm 12. The attachment portion 113 also serves as a lid for closing an opening on the second arm 12 side in the stator holding portion 11h.

Next, the base 120 will be described. As shown in FIG. 2, the base 120 fixed to a tip end portion of the first arm 11 has a shape in which a hollow cylinder stands up from a disk having a through hole in a central portion thereof. The base 120 includes an encoder portion 121, a shaft portion 122, and a rotating portion 123.

The encoder portion 121 closes an opening (a lower opening in FIG. 2) on the opposite side of the second arm 12 in the stator holding portion 11h. On the upper surface side of the encoder portion 121, a processing substrate 121e of the encoder is provided.

On the lower surface side of the rotating portion 123 which rotates with the rotor portion 110, a disk having a repeating pattern such as slits and irregularities is provided along the circumferential direction. On the upper surface side of the processing substrate 121e, a light emitting portion and a light receiving portion are provided, for example. The processing substrate 121e detects reflected light in which light emitted from the light emitting portion toward the rotating portion 123 is reflected by the above-described pattern to detect a state of rotation of the rotor portion 110.

As shown in FIG. 2, an encoder cable 121c is connected to the processing substrate 121e, and power supply to the processing substrate 121e and output of signals such as detection results are performed. The encoder cable 121c is guided to the proximal end of the first arm 11 via an internal space of the stator holding portion 11h below the rotor portion 110. Although the encoder cable 121c is accessible from below the first arm 11, this point will be described later with reference to FIG. 6.

Here, the built-in motor 150 does not have a reduction gear and directly causes the second arm 12 to pivot. In the second arm 12, the turning angle is limited to less than 360 degrees by a mechanical stopper or the like. Therefore, the built-in motor 150 does not make one rotation.

Generally, in a motor that makes one or more rotations, the encoder detects how many rotations the motor has made from a reference position, and stores the detection result. For this reason, the rotating portion 123 is usually provided with a disk magnetized with a mark that indicates that one rotation has made, and the processing substrate 121e is usually provided with a circuit that detects magnetic force and a volatile memory that records the number of rotations. Then, a battery is provided which energizes the volatile memory via the encoder cable 121c. The battery is provided, for example, on the inner side surface of the main body 15 (see FIG. 1) in consideration of maintainability.

On the other hand, since the rotation of the built-in motor 150 is less than one rotation, it is not necessary to provide the above-described "magnetized disk" in the rotating portion 123. In addition, the circuit, volatile memory, and battery described above are also unnecessary. Therefore, with the built-in motor 150, the structure can be simplified, which can also contribute to cost reduction and miniaturization.

The shaft portion 122 has a cylindrical shape rising from the encoder portion 121, and has an axial length which protrudes from the first arm 11 and reaches the inside of the second arm 12. A cylindrical cable guide 12g fixed to the second arm 12 is inserted into the inner peripheral side of the shaft portion 122.

A cable in the second arm 12 is routed inside the first arm 11 via the cable guide 12g. As described above, by using the cable guide 12g, it is possible to prevent rubbing of the cable and the shaft portion 122 accompanying turning of the second arm 12.

On the outer peripheral side of the shaft portion 122, a first bearing b1, a spacer bs, and a second bearing b2 are provided. Here, the inner peripheral sides of the first bearing b1 and the second bearing b2 are fixed to the shaft portion 122. The spacer bs is used to maintain a distance between the first bearing b1 and the second bearing b2 at a predetermined interval.

A bearing presser 122a is provided on the tip end side (the second bearing b2 side) of the shaft portion 122. Here, when assembling, the first bearing b1, the spacer bs, and the second bearing b2 are inserted into the rotating portion 123, and the rotating portion 123 into which the bearing and so on are inserted is inserted into the shaft portion 122. Each part is assembled by attaching the bearing presser 122a. The bearing presser 122a and the shaft portion 122 may be collectively referred to as the shaft portion 122.

On the other hand, the rotating portion 123 is fixed to the outer peripheral side of the first bearing b1 and the second bearing b2. The rotating portion 123 has a cylindrical shape, and while the inner peripheral side is fixed to the outer peripheral sides of the first bearing b1 and the second bearing b2, and the outer peripheral side is fixed to the inner peripheral side of the rotor portion 110. Consequently, the rotor portion 110 is rotated relative to the base 120.

Thus, the first bearing b1 and the second bearing b2 rotatably support the rotor portion 110. Since the base 120 includes the bearings, the configuration of the rotor portion 110 can be simplified, and, at the same time, assemblability of the built-in motor 150 can be improved.

As shown in FIG. 2, the first bearing b1 and the second bearing b2 are accommodated in a thickness (thickness in the direction in alignment with the axis of rotation of the rotor portion 110) range of the cylindrical stator portion 100. By thus arranging the bearing that allows the rotor portion 110 to rotate, it is possible to reduce the height of the built-in motor 150.

Here, when the rotor portion 110 is assembled to the base 120, for example, the shaft portion 111 and the rotating portion 123 are fastened with a bolt or the like. Thus, the rotor portion 110 is fixed to the rotating portion 123. The rotor portion 110 may be fixed to the rotating portion 123 by adhesion or the like.

Thus, the stator portion 110 is fixed to the stator holding portion 11h from above the first arm 11, and the base 120 is fixed to the stator holding portion 11h from below the first arm 11. Since the rotor portion 110 is fixed to the base 120 from above the first arm 11, the built-in motor 150 is completed.

Although FIG. 2 shows the case where the first arm 11 includes the built-in motor 150 which causes the second arm 12 to pivot, the second arm 12 may include the built-in motor 150 which causes the second arm 12 to pivot. This point will be described later with reference to FIG. 9.

Although FIG. 2 shows the case where the bearings (the first bearing b1 and the second bearing b2) are provided on the base 120 side and the rotor portion 110 rotates relative to the base 120, the bearings may be provided on the rotor portion 110 side. In this case, the outer peripheral side of the bearing may be fixed to the inner peripheral side of the shaft portion 111 in the rotor portion 110, and the rotor portion 110 to which the bearing is fixed may be fitted to the outer peripheral side of the shaft portion 122 in the base 120.

Although the two bearings (the first bearing b1 and the second bearing b2) are shown in FIG. 2, one or three or more bearings may be provided. The spacer bs provided between the bearings may be omitted.

Although the single built-in motor 150 for arm pivoting is shown in FIG. 2, a plurality of the built-in motors 150 may be provided. For example, the built-in motor 150 which causes the first arm 11 to pivot and the built-in motor 150 which causes the second arm 12 to pivot may be provided at both ends of the first arm 11. The built-in motor 150 which causes the second arm 12 to pivot may be provided at the proximal end of the second arm 12, and the built-in motor 150 which causes the first arm 11 to pivot may be provided at the proximal end of the first arm 11.

Figure 3:
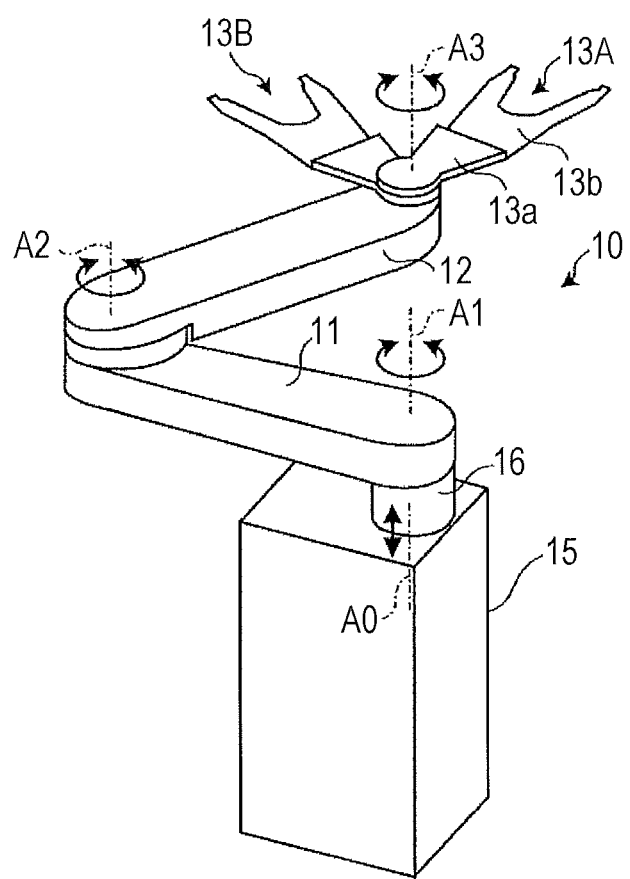
FIG. 3 is a perspective view of the transfer robot.

Next, the configuration of the transfer robot 10 will be further described with reference to FIG. 3. FIG. 3 is a perspective view of the transfer robot 10. As shown in FIG. 3, the transfer robot 10 includes the main body 15, the lift portion 16, the first arm 11, the second arm 12, and a plurality of the hands 13.

Here, in order to distinguish each hand, capital alphabetic characters are appended to the end like a hand 13A and a hand 13B, and when not distinguishing each hand, it is described as the hand 13. In the present embodiment, the same may be adopted for other components.

Although FIG. 3 shows the transfer robot 10 including the two hands 13A and 13B, any number of the hands 13 may be provided. Further, it is preferable that a lift axis A0, a first axis A1, a second axis A2, and a third axis A3 shown in FIG. 3 be parallel to each other.

The main body 15 incorporates a mechanism for raising and lowering the lift portion 16. The lift portion 16 rises and lowers along the lift axis A0 shown in FIG. 3 and supports the proximal end of the first arm 11 rotatably around the first axis A1. The lift portion 16 itself may be rotated about the first axis A1.

The first arm 11 supports, at its tip end, the proximal end of the second arm 12 rotatably around the second axis A2. The second arm 12 supports, at its tip end, the proximal ends of the hands 13A and 13B rotatably around the third axis A3. The hands 13A and 13B include a base portion 13a and a fork portion 13b.

Thus, the transfer robot 10 is a three-link horizontal articulated robot having the first arm 11, the second arm 12, and the hand 13. As described above, since the transfer robot 10 has a lift mechanism, the transfer robot 10 can access objects to be transferred such as substrates arranged at different heights.

Figure 4:
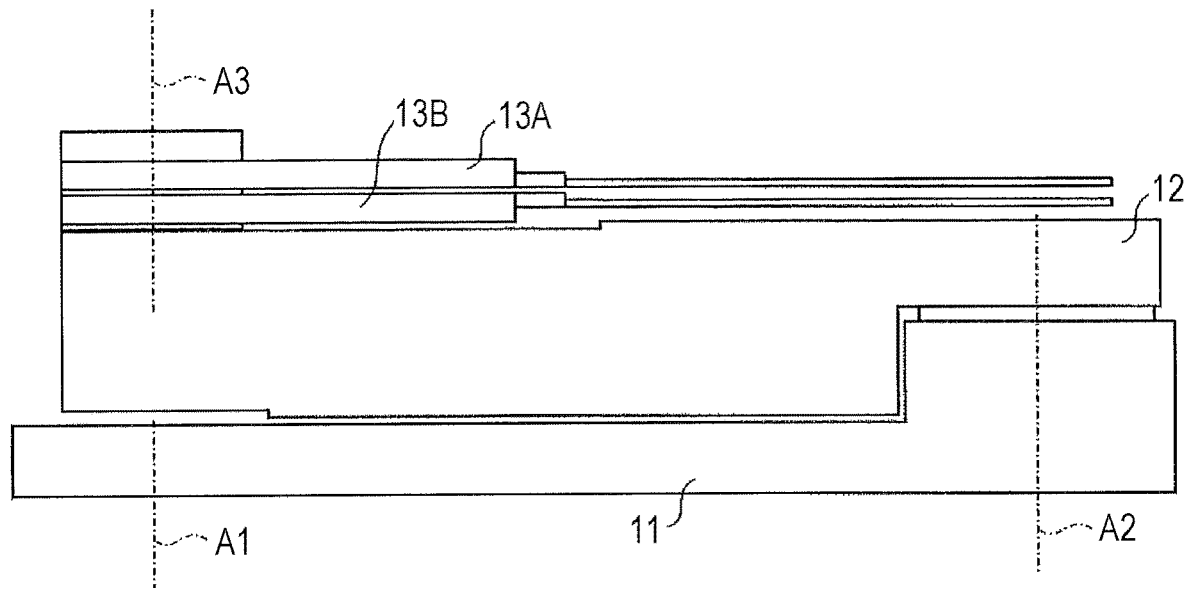
FIG. 4 is a side view of a first arm, a second arm, and a hand.

Next, the appearance of the first arm 11, the second arm 12, and the hand 13 will be described with reference to FIG. 4. FIG. 4 is a side view of the first arm 11, the second arm 12, and the hand 13. FIG. 4 shows the first arm 11, the second arm 12, and the hand 13 in the folded posture.

In FIG. 4, the first axis A1, the second axis A2, and the third axis A3 shown in FIG. 3 are shown for reference. The "folded posture" refers to a posture in which the tip end of the second arm 12 faces the proximal end of the first arm 11 and the tip end of the hand 13 faces the proximal end of the second arm 12.

As shown in FIG. 4, the bottom surface side of the first arm 11 is substantially flat. On the other hand, on the upper surface side, an upper surface of an end on the side of the second axis A2 has a stepped shape higher than an upper surface of an end on the side of the first axis A1. As described above, the upper surface of the end on the second axis A2 side protrudes toward the second arm 12 in order to dispose the built-in motor 150 shown in FIG. 1 in the first arm 11.

Thus, in the side view, in the first arm 11, thickness of an end (an example of "a first connection portion") where the built-in motor 150 is disposed is larger than thickness of other portions, and the first arm 11 has a shape protruding toward the second arm 12.

As shown in FIG. 4, the upper surface side of the second arm 12 is substantially flat. On the other hand, on the bottom surface side, a lower surface of one end on the side of the second axis A2 has a stepped shape higher than a bottom surface of the other end. The reason why the bottom surface of the end on the second axis A2 side is thus recessed from the bottom surface of the other end is to avoid the protruding shape of the first arm 11 described above.

Thus, in the side view, in the second arm 12, thickness on the other end side is larger than thickness on the side of the end (an example of "a second connection portion") corresponding to the second axis A2, and the second arm 12 has a shape protruding toward the first arm 11. Therefore, a volume of the thick portion can be increased, and it is easy to secure inside a space to store a mechanism for driving the hand 13.

The hand 13 is provided on an upper surface of an end of the second arm 12 opposite to the end on the second axis A2 side. The two hands 13 are provided in order of the hand 13B and the hand 13A as viewed from the second arm 12 along the third axis A3.

Figure 5:
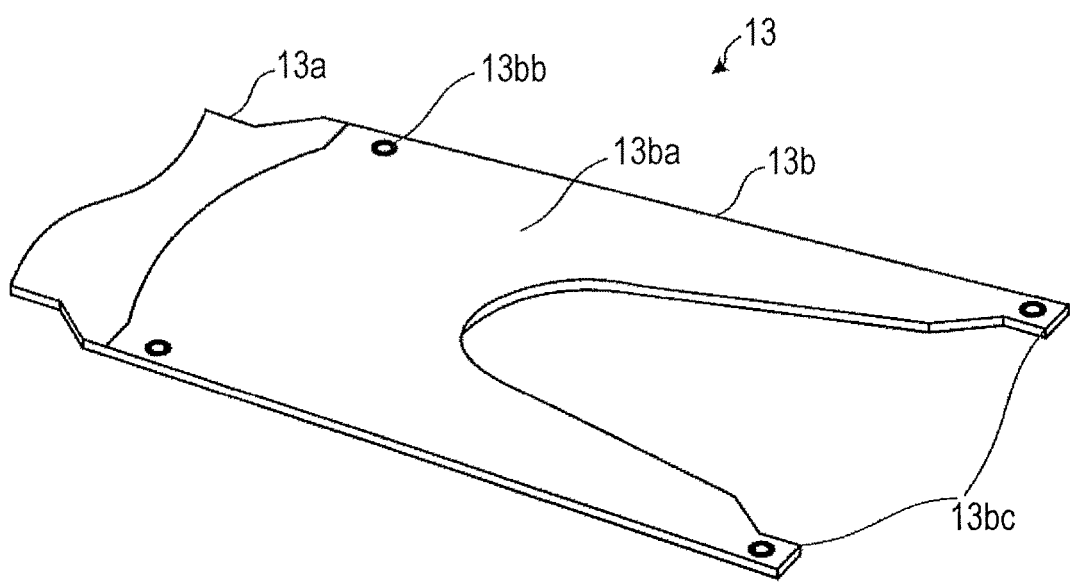
FIG. 5 is a perspective view of the hand.

Next, the configuration of the hand 13 will be described in more detail with reference to FIG. 5. FIG. 5 is a perspective view of the hand 13. FIG. 5 corresponds to a view of the hand 13 viewed obliquely from above.

As shown in FIG. 5, the hand 13 includes the base portion 13a and the fork portion 13b. The proximal end side of the base portion 13a is supported by the second arm 12 (see FIG. 3) so as to be rotatable about the third axis A3. The fork portion 13b is provided on the tip end side of the base portion 13a, and the tip end side of the fork portion 13b is bifurcated.

As shown in FIG. 5, a friction portion 13bb is provided on an upper surface 13ba of the fork portion 13b. For example, the friction portion 13bb is an O-ring fixed so as to be partially embedded in a groove formed on the upper surface 13ba.

As a material of the O-ring, for example, a resin such as silicon can be used. The friction portion 13bb prevents displacement of a transferred object such as a substrate by frictional force with the transferred object. A claw projecting upward may be provided at a tip end 13bc of the fork portion 13b. This makes it possible to prevent falling of the object to be transferred.

Although the friction portion 13bb is illustrated in FIG. 5, a holding mechanism such as an adsorption mechanism for adsorbing an object to be transferred or a gripping mechanism for gripping an object to be transferred may be used.

Figure 6A:
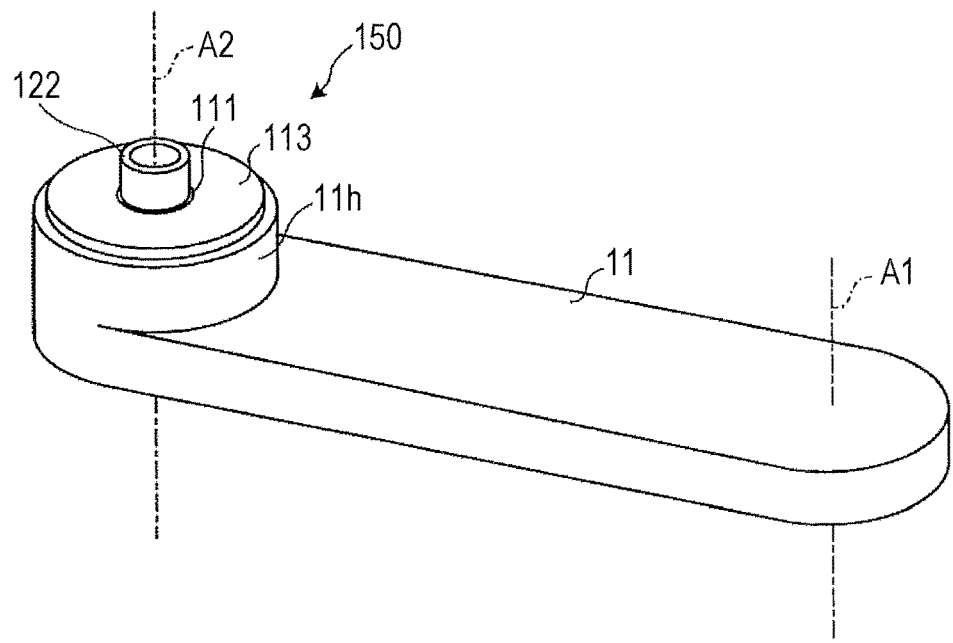
FIG. 6A is a first perspective view of the first arm.
Figure 6B:
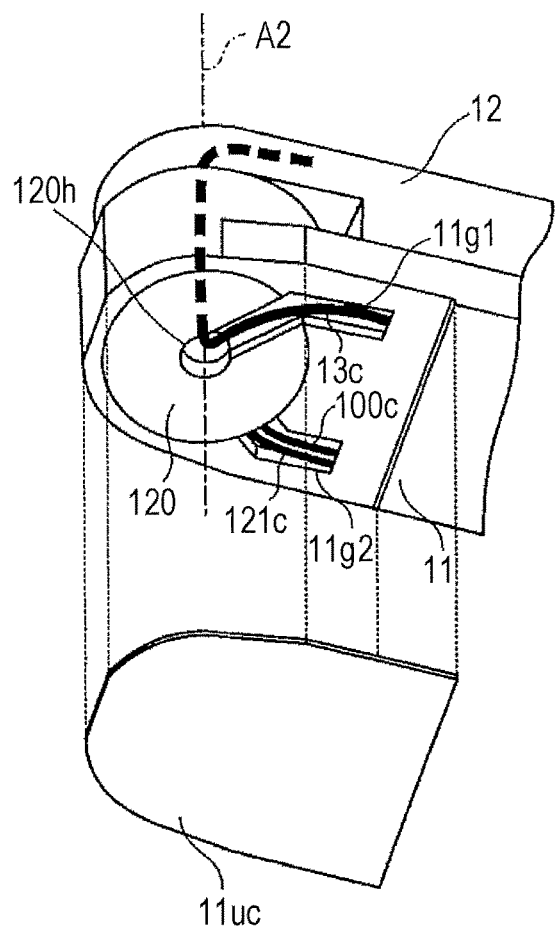
FIG. 6B is a second perspective view of the first arm.

Next, the configuration of the first arm 11 will be described in more detail with reference to FIGS. 6A and 6B. FIG. 6A is a first perspective view of the first arm 11, and FIG. 6B is a second perspective view of the first arm 11. FIG. 6A corresponds to a perspective view of the first arm 11 viewed obliquely from above, and FIG. 6B corresponds to a perspective view of the first arm 11 viewed obliquely from below.

As shown in FIG. 6A, the built-in motor 150 is provided at an end on the second axis A2 side in the first arm 11. The stator holding portion 11h corresponding to the case of the built-in motor 150 protrudes upward from the upper surface of the first arm 11. The attachment portion 113 fixed to the shaft portion 111 in the rotor portion 110 (see FIG. 1) rotates around the second axis A2. The second arm 12 is fixed to the attachment portion 113.

The shaft portion 122 (see FIG. 2) in the base 120 (see FIG. 1) protrudes from the attachment portion 113 along the second axis A2. Since the base 120 is fixed to the first arm 11, the shaft portion 122 does not rotate. The first axis A1 which is a turning center of the first arm 11 is set at an end opposite to the end on the second axis A2 side.

FIG. 6B shows the end on the second axis A2 side in the first arm 11 and the second arm 12. As shown in FIG. 6B, a through hole 120h is provided in the bottom surface of the encoder portion 121 in the base 120. The through hole 120h communicates with an opening of the shaft portion 122 shown in FIG. 6A.

As shown in FIG. 6B, a groove is formed radially on the bottom surface of the encoder portion 121, and the groove serves as an opening 11g1 connected to a groove communicating with the inside of the first arm 11 and opened downward. Therefore, a cable 13c inside the second arm 12 can be routed inside the first arm 11 via the through hole 120h communicating with the shaft portion 122 in the base 120 and the opening 11g1. That is, the cable 13c can be accommodated in the outer shapes of the first arm 11 and the second arm 12.

In addition, a groove communicating with the inside of the first arm 11 is formed outside the bottom surface of the encoder portion 121, and the groove serves as an opening 11g2 opened downward. Inside the opening 11g2, the winding cable 100c extending from the motor winding 100b in the stator portion 100 and the encoder cable 121c extending from the encoder portion 121 are accommodated.

That is, the winding cable 100c and the encoder cable 121c can be routed inside the first arm 11 via the opening 11g2. That is, the winding cable 100c and the encoder cable 121c can be accommodated in the outer shape of the first arm 11.

As shown in FIG. 6B, a detachable cover 11uc may be provided to cover the through hole 120h, the opening 11g1, and the opening 11g2. By removing the cover 11uc, an assembly operation of the transfer robot 10 can be made efficient, and the maintainability can be improved. On the other hand, by attaching the cover 11uc, it is possible to prevent minute dust and the like from leaking from the inside to the outside of the transfer robot 10.

As shown in FIG. 6B, the bottom surface side of the first arm 11 is formed thinner by the thickness of the cover 11uc. Therefore, even when the cover 11uc is attached to the first arm 11, the bottom surface of the first arm 11 can be made flat.

Figure 7A:
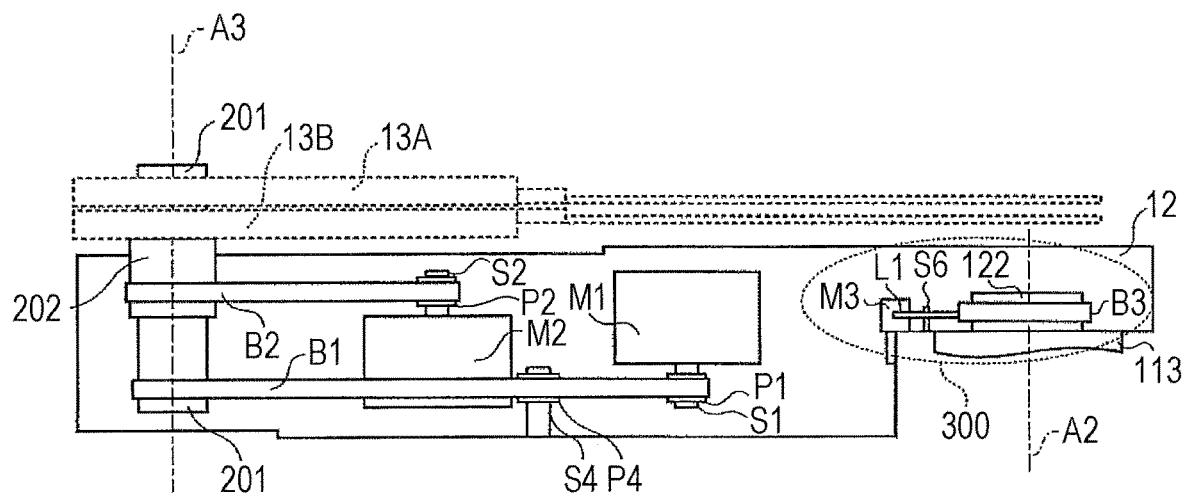
FIG. 7A is a first schematic view of the second arm.
Figure 7B:
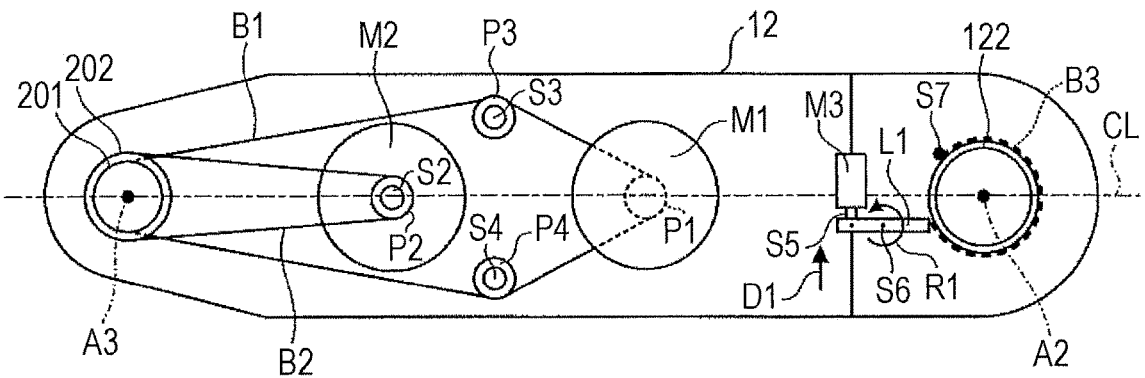
FIG. 7B is a second schematic view of the second arm.

Next, the configuration of the second arm 12 will be described in more detail with reference to FIGS. 7A and 7B. FIG. 7A is a first schematic view of the second arm 12, and FIG. 7B is a second schematic view of the second arm 12. FIG. 7A corresponds to a see-through plan view of the inside of the second arm 12 viewed from the side, and FIG. 7B corresponds to a see-through plan view of the inside of the second arm 12 viewed from above.

As shown in FIG. 7A, in order to cause the two hands 13A and 13B to operate independently, the second arm 12 includes two rotary motors M1 and M2 and two belts B1 and B2 for respectively transmitting driving force of the rotary motors M1 and M2 to the hands 13A and 13B. Unlike the built-in motor 150 described above, the rotary motors M1 and M2 are finished motors provided with a case. Such a finished motor is also referred to as a "removable motor".

Here, the rotary motors M1 and M2 and the belts B1 and B2 are accommodated in the thick portion of the second arm 12 already described with reference to FIG. 4. On the other hand, a rotation suppression unit (an example of a "brake") 300 is accommodated in a thin portion of the second arm 12.

First, a drive mechanism using the rotary motors M1 and M2 and the belts B1 and B2 will be described. As shown in FIG. 7A, the two rotary motors M1 and M2 are arranged such that projecting directions of output shafts S1 and S2 are opposite to each other.

The driving force of the rotary motor M1 is transmitted to a rotating shaft 201 which causes the hand 13A to pivot around the third axis A3 via a pulley P1 attached to the output shaft S1 and the belt B1.

The driving force of the rotary motor M2 is transmitted to a rotating shaft 202 which causes the hand 13B to pivot around the third axis A3 via a pulley P2 attached to the output shaft S2 and the belt B2.

The pulley is each fixed to the rotating shafts 201 and 202, and the driving force is transmitted via the pulley. Therefore, by adjusting the outer diameter of the pulley, the reduction ratio of the rotary motors M1 and M2 can be set to any value.

The hand 13A as the upper hand is connected to the cylindrical rotating shaft 201 fixed to the second arm 12 via a bearing. Therefore, the hand 13A pivots as the rotating shaft 201 rotates with along the rotation of the rotary motor M1.

A cylindrical cable guide (similar to the cable guide 12g shown in FIG. 2) communicating with the inside of the hand 13A is inserted inside the cylindrical rotating shaft 201. Such a cable guide serves to safely route a cable inside the hand 13A into the second arm 12.

The hand 13B as the lower hand is connected to the hollow rotating shaft 202 fixed to the second arm 12 via a bearing. Here, the inner diameter of the rotating shaft 202 is larger than the outer diameter of the rotating shaft 201 which rotates with the hand 13A.

That is, the rotating shaft 202 and the rotating shaft 201 are arranged in a double cylinder shape sharing the rotating shaft. As shown in FIG. 2, the rotating shaft 202 is disposed on the upper side in the rotating shaft 201, and only the upper side is formed in a double cylinder shape. Therefore, on the lower side of the rotating shaft 201, the rotating shaft 201 is not covered with the rotating shaft 202 but exposed, so that the driving force can be easily transmitted by the belt B1.

As shown in FIG. 7B, shafts S3 and S4 and pulleys P3 and P4 that rotate around the shafts S3 and S4 are provided inside the belt B1 in order to widen a passing track of the belt B1. Thus, a desired tension can be applied to the belt B1, and, at the same time, the belt B1 can be prevented from coming into contact with the rotary motor M2. Since the rotary motors M1 and M2 can be arranged close to each other vertically, the second arm 12 can be thinned.

Preferably, the output shafts S1 and S2 of the rotary motors M1 and M2 are arranged on a center line CL connecting the second axis A2 and the third axis A3, and the pulleys P3 and P4 are arranged symmetrically about the center line CL. This makes it easy to balance a weight balance of the second arm 12 with respect to the center line CL.

Thus, the belts B1 and B2 are arranged so that at least a part of them nests in top view. Thus, the width of the second arm 12 (the width in the normal direction of the center line CL) can be reduced.

Next, the rotation suppression unit 300 will be described. As shown in FIG. 7A, the rotation suppression unit 300 includes a friction band B3 wound around the outer periphery of the shaft portion 122 of the base 120 in the built-in motor 150 which has entered the inside of the second arm 12. The friction band B3 is connected to one end side of a link L1 that pivots around a shaft S6, and the other end side of the link L1 is pivotably connected to a linear motion shaft of a linear motion actuator M3.

For example, in the friction band B3, at least the surface on the shaft portion 122 side is processed to increase the frictional force. The friction band B3 may be formed of a material such as silicone rubber that originally has a large frictional force.

As the linear motion actuator M3, a mechanism may be used in which a linear motion shaft biased in either the forward or backward direction by a spring or the like is advanced or retracted using an electromagnetic force. A linear motion motor which can control the amount of advancement and retraction of a linear motion shaft may be used as the linear motion actuator M3.

Here, the attachment portion 113 which rotates with the rotor portion 110 in the built-in motor 150 is fixed to the second arm 12. Therefore, if the rotation of the shaft portion 122 is stopped, the pivoting of the second arm 12 can be stopped.

That is, the friction band B3 changes its inner diameter as the linear motion shaft of the linear motion actuator M3 advances and retracts. When the friction band B3 is wound around the outer periphery of the shaft portion 122, the rotation of the shaft portion 122 is stopped by the frictional force. That is, the rotation of the shaft portion 122 is suppressed. On the other hand, when the friction band B3 is separated from the outer periphery of the shaft portion 122, the rotation of the shaft portion 122 is permitted.

As shown in FIG. 7B, one end of the friction band B3 is fixed to the shaft S7, and the other end is connected to one end of the link L1. That is, the friction band B3 has an arc shape along the outer periphery of the shaft portion 122 in top view, and elastically deforms when an external force is applied.

A biasing force in a counterclockwise direction is applied to the shaft S6, which is a pivot shaft of the link L1, by a spring or the like (see a rotation direction R1). When no electric power is supplied to the linear motion actuator M3, a linear motion shaft S5 of the linear motion actuator M3 is in an extended state by the biasing force. The friction band B3 is in a state of being wound around the outer periphery of the shaft portion 122 and suppressing the rotation of the shaft portion 122.

As described above, when a situation such as interruption of a power supply occurs, relative pivoting between the first arm 11 and the second arm 12 is suppressed, and the arm can be prevented from continuing unintended movement. When no electric power is supplied to the built-in motor 150, it is possible to prevent each arm from pivoting due to external force or gravity.

For example, at the time of installation of the transfer robot 10, the arm can be prevented from freely pivoting and coming into contact with surrounding obstacles. When a power failure or the like occurs, it is possible to prevent the pivoting arm from pivoting as it is.

On the other hand, when electric power is supplied to the linear motion actuator M3, the linear motion shaft S5 contracts against the biasing force around the shaft S6 (see direction D1). Consequently, the inner diameter of the friction band B3 spreads and separates from the outer periphery of the shaft portion 122. Thus, the friction band B3 allows the rotation of the shaft portion 122.

The biasing force about the shaft S6 may be reversed (clockwise), and the movement of the linear motion shaft S5 according to presence or absence of the power supply may be reversed. A mechanism of the rotation suppression unit 300 may be a mechanism different from the mechanism shown in FIG. 7A or 7B. For example, a concavo-convex portion may be provided on the outer periphery of the shaft portion 122, and the rotation of the shaft portion 122 may be suppressed by stopping rotation of a gear engaged with the concavo-convex portion.

Thus, by providing the rotation suppression unit 300 in an arm (the second arm 12 in FIGS. 7A and 7B) other than the arm having the built-in motor 150, the arm (the first arm 11 in FIGS. 7A and 7B) provided with the built-in motor 150 can be miniaturized. The rotation suppression unit 300 may be provided in the arm (the first arm 11 in FIGS. 7A and 7B) having the built-in motor 150.

Figure 8A:
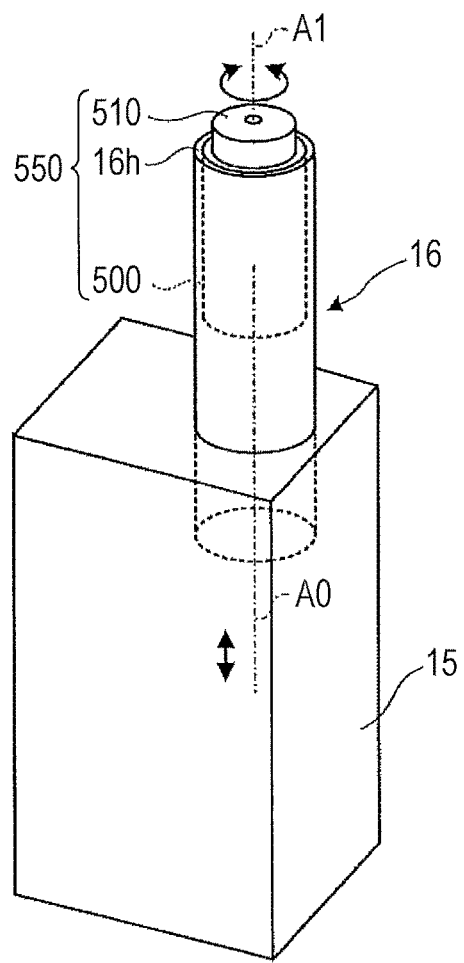
FIG. 8A is a perspective view of a lift portion.
Figure 8B:
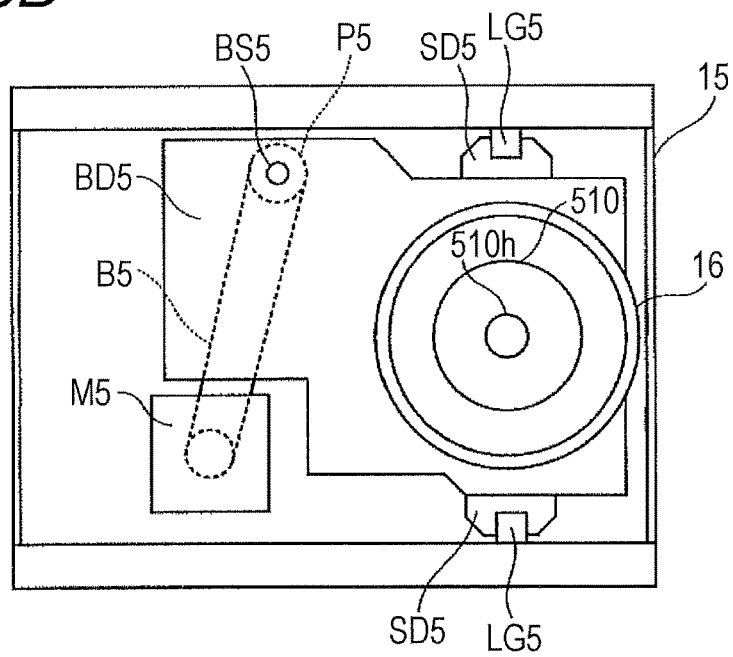
FIG. 8B is a schematic view of a lift portion.

Next, the lift portion 16 shown in FIG. 1 and the like will be described in more detail with reference to FIGS. 8A and 8B. FIG. 8A is a perspective view of the lift portion 16, and FIG. 8B is a schematic view of the lift portion 16. FIG. 8A is a perspective view of the lift portion 16 rising and lowering with respect to the main body 15 as viewed obliquely from above. FIG. 8B corresponds to a see-through plan view of the main body 15 viewed from above.

As shown in FIG. 8A, the lift portion 16 rises and lowers with respect to the main body 15 in a direction of the lift axis A0. The lift portion 16 has, for example, a cylindrical shape in a portion projecting from the main body 15 and includes on its upper end side a lift portion-integrated built-in motor 550 which causes the first arm 11 to pivot around the first axis A1. The lift portion-integrated built-in motor 550 has no case like the built-in motor 150 shown in FIG. 1 and the like and is a motor of a type which causes an object to be attached to hold a stator portion 500.

Specifically, the lift portion 16 includes a substantially cylindrical stator holding portion 16h on the upper end side, and the stator holding portion 16h substitutes for a case of the built-in motor 550. Specifically, the stator holding portion 16h holds the inserted stator portion 500, and the rotor portion 510, which rotates with respect to the stator portion 500, is similarly inserted into the stator holding portion 16h.

As described above, the built-in motor 550 includes the stator portion 500, the rotor portion 510 that rotates with respect to the stator portion 500, and the stator holding portion 16h that is formed in the lift portion 16 and that holds the stator portion 500. Here, the built-in motor 550 shown in FIG. 8A is larger in thickness (thickness along the lift axis A0 shown in FIG. 8A) than the built-in motor 150 shown in FIG. 1 and the like.

This is because the built-in motor 550 that drives the first arm 11 requires a larger motor capacity (torque) than the built-in motor 150 that drives the second arm 12. That is, by increasing the thickness, it becomes easy to increase a winding amount and to increase an amount of permanent magnet, so that the motor capacity can be increased.

The lift portion 16 may not have a cylindrical shape. For example, the lift portion 16 may have an arbitrary shape such as a rectangular parallelepiped shape. That is, as long as the stator holding portion 16h having a shape that functions as a case of the stator portion 500 and the rotor portion 510 can be formed, the shape of the lift portion 16 can be any shape.

As shown in FIG. 8B, a lift mechanism of the lift portion 16 is stored in the main body 15. The lift portion 16 is supported on the upper surface side of a movable unit BD5. On the inner wall side of the main body 15, a pair of linear guides LG5 extending along the lift axis A0 shown in FIG. 8A is provided. The movable unit BD5 is provided with a pair of sliders SD5 which slide along the pair of linear guides LG5. The rotor portion 510 is provided with a through hole 510h. Consequently, a cable or the like from the first arm 11 (see FIG. 1) can be guided to the inside of the main body 15.

The main body 15 is provided with a ball screw BS5 extending along the lift axis A0 shown in FIG. 8A, and the movable unit BD5 rises and lowers with the rotation of the ball screw BS5. The ball screw BS5 includes a pulley P5. The driving force of a rotary motor M5 is transmitted to the pulley P5 via a belt B5, whereby the ball screw BS5 rotates.

As described above, the movable unit BD5 can be raised and lowered by changing the rotational direction of the rotary motor M5. That is, the lift portion 16 can be raised and lowered. Since the lift portion 16 is guided by the pair of linear guides LG5, the lift portion 16 can rise and lower with high accuracy.

Figure 9:
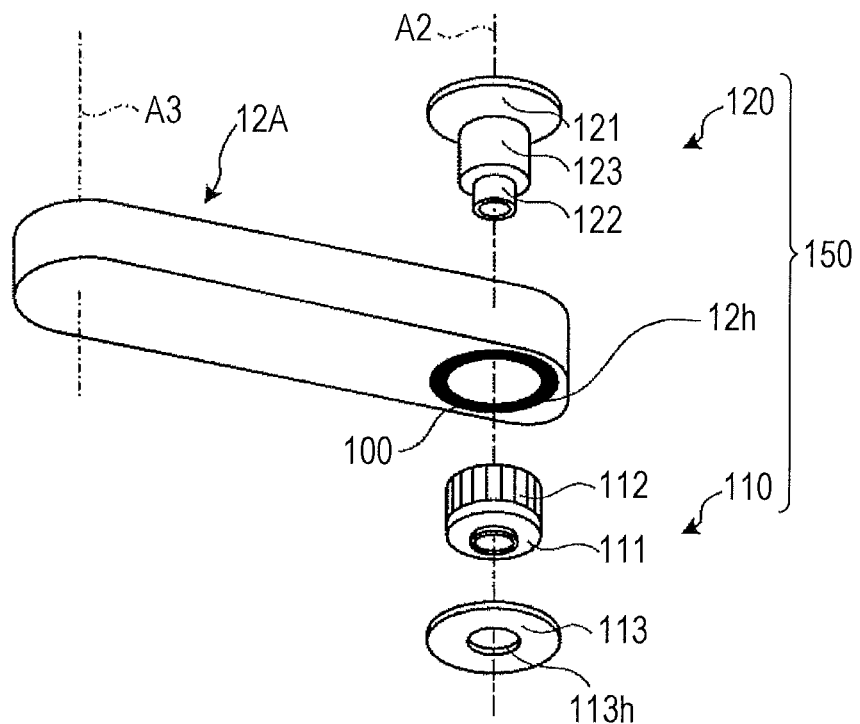
FIG. 9 is a perspective view showing a second arm according to a modification.

Next, a second arm 12A according to a modification will be described with reference to FIG. 9. FIG. 9 is a perspective view showing the second arm 12A according to the modification. FIG. 9 corresponds to a perspective view of the second arm 12A as viewed obliquely from below. FIG. 9 shows a case where the built-in motor 150 provided in the first arm 11 in FIG. 1 is provided in the second arm 12A. The details of the built-in motor 150 have already been described, and therefore the description will be omitted as appropriate.

As shown in FIG. 9, the built-in motor 150 is provided at an end on the second axis A2 side. The second arm 12A includes a stator holding portion 12h and holds the stator portion 100. The attachment direction of the built-in motor 150 is upside down from the case shown in FIG. 1. The attachment portion 113, which rotates with the rotation of the rotor portion 110, is fixed to the upper surface side of the first arm 11 (see FIG. 1). Thus, when the built-in motor 150 rotates, the second arm 12A pivots relative to the first arm 11 about the second axis A2.

The lower surface side of the second arm 12A provided with the built-in motor 150 can be made flat according to the maximum thickness shown in FIG. 4. Accordingly, the upper surface side of the first arm 11 from which the built-in motor 150 is omitted can be made flat according to the minimum thickness. The rotation suppression unit 300 shown in FIG. 7A can be provided in the first arm 11.

Although FIG. 9 illustrates the case where the built-in motor 150 is provided in the second arm 12A instead of the built-in motor 150 shown in FIG. 1, for example, the built-in motor 150 may be provided at the proximal end of the first arm 11 in the same direction as in FIG. 9 instead of the built-in motor 550 shown in FIG. 8A.

Figure 10:
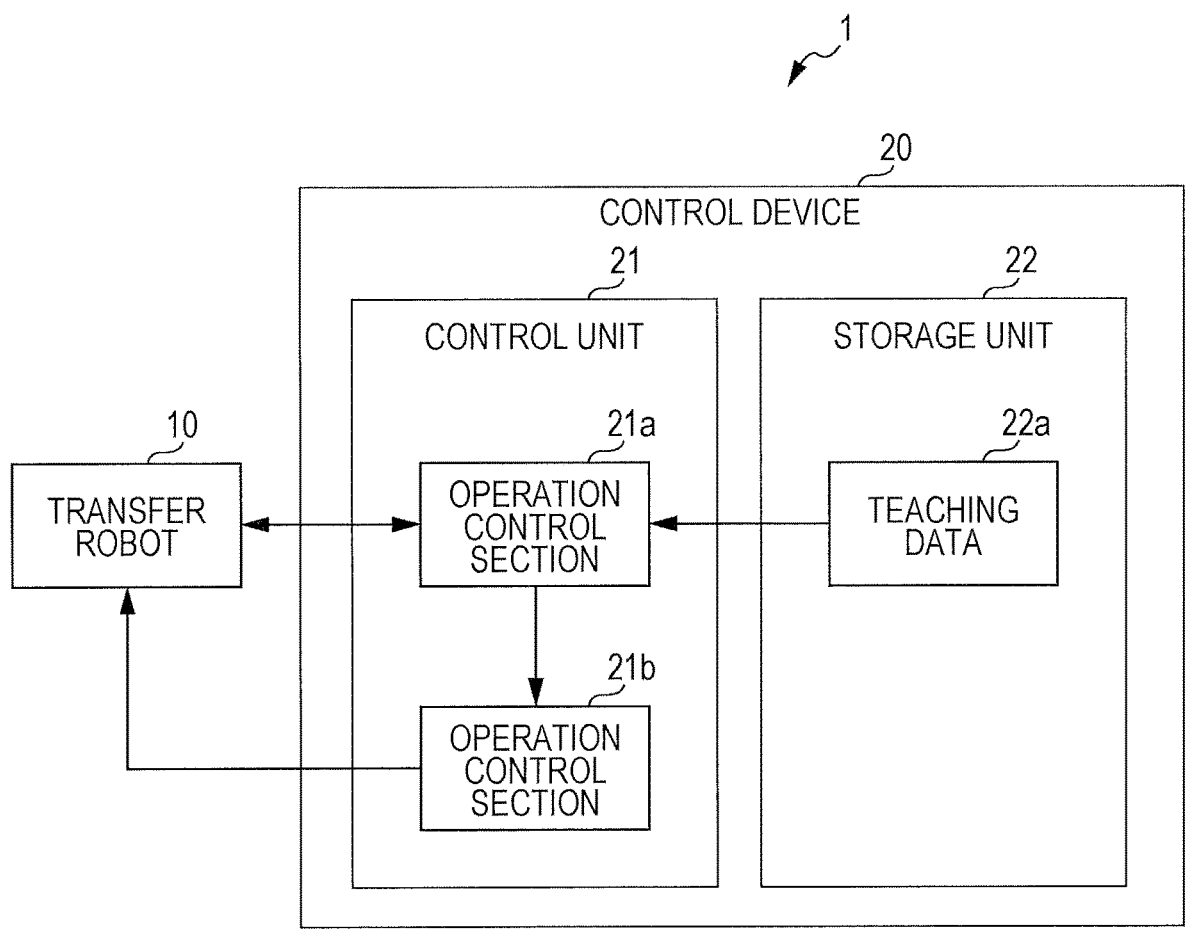
FIG. 10 is a block diagram of a robot system.

Next, a robot system 1 including the transfer robot 10 and a control device (an example of "control circuitry") 20 for controlling the operation of the transfer robot 10 will be described with reference to FIG. 10. FIG. 10 is a block diagram of the robot system 1. The configuration and the like of the transfer robot 10 have already been described, and therefore the configuration of the control device 20 will be mainly described below. In FIG. 10, an input terminal device such as a so-called pendant connected to the control device 20 is omitted.

As shown in FIG. 10, the control device 20 includes a control unit 21 and a storage unit 22. The control unit 21 includes an operation control section 21a and an operation suppression section 21b. The storage unit 22 stores teaching data 22a. The control device 20 is connected to the transfer robot 10.

Here, the control device 20 includes, for example, a computer having a central processing unit (CPU), a read only memory (ROM), a random access memory (RAM), a hard disk drive (HDD), an input/output port and the like and various circuits.

The CPU of the computer reads and executes a program stored in the ROM, for example, to function as the operation control section 21a and the operation suppression section 21b of the control unit 21.

At least one or both of the operation control section 21a and the operation suppression section 21b of the control unit 21 can be configured by hardware such as an application specific integrated circuit (ASIC) or a field programmable gate array (FPGA).

The storage unit 22 corresponds to, for example, a RAM or an HDD. The RAM or HDD can store the teaching data 22a. The control device 20 may acquire the above-described program and various pieces of information via another computer connected via a wired or wireless network or a portable recording medium.

The control unit 21 of the control device 20 controls the operation of the transfer robot 10 based on the teaching data 22a. For example, when an error occurs in the operation of the transfer robot 10, a process of suppressing the operation of the transfer robot 10 is performed.

The operation control section 21a controls the operation of the transfer robot 10 based on the teaching data 22a. Specifically, the operation control section 21a instructs the motor corresponding to each axis in the transfer robot 10, based on the teaching data 22a stored in the storage unit 22, to cause the transfer robot 10 to transfer an object to be transferred such as a substrate. Further, the operation control section 21a performs feedback control using the encoder value of the motor, for example, to improve operation accuracy of the transfer robot 10.

The operation suppression section 21b acquires an operation status of the transfer robot 10 from the operation control section 21a, and for example when an error occurs in the operation of the transfer robot 10, the operation suppression section 21b executes an operation suppression process such as stopping the operation of the transfer robot 10. For example, the operation suppression section 21b stops the energization to the rotation suppression unit 300 shown in FIG. 7A and the like to apply the brake on movement of joints of the transfer robot 10.

Consequently, it is possible to prevent the arm and the like of the transfer robot 10 from being displaced by an external force or the like. Even when there is no instruction from the control device 20, the rotation suppression unit 300 executes rotation suppression operation if the energization to the transfer robot 10 is stopped.

The teaching data 22a is generated in a teaching step of teaching motions to the transfer robot 10 and is information including a "job" which is a program defining the motion of the transfer robot 10 including the movement trajectory of the hand 13 (see FIG. 1). The teaching data 22a generated by another computer connected via a wired or wireless network may be stored in the storage unit 22.

As described above, the transfer robot 10 according to the present embodiment includes the plurality of horizontal link arms 11 and 12 for moving the hand 13 capable of holding an object to be transferred. At least one of the plurality of arms 11 and 12 includes the arm-integrated built-in motor 150 which causes their own or another arm to directly pivot.

Thus, with the arm-integrated built-in motor 150, the arms 11 and 12 can be miniaturized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

Obviously, numerous modifications and variations of the present invention are possible in light of the above teachings. It is therefore to be understood that within the scope of the appended claims, the invention may be practiced otherwise than as specifically described herein.

What is claimed is:

1. A transfer robot comprising:
   a main body;
   one arm connected to the main body rotatably around a first axis;
   another arm connected to the one arm via a shaft such that the another arm is rotatable relatively with respect to the one arm around a shaft axis of the shaft;
   the shaft comprising:
      a first shaft portion fixed to the one arm and having an axis coaxial with the shaft axis; and
      a second shaft portion fixed to the another arm and connected to the first shaft portion via a bearing such that the second shaft portion is rotatable around the shaft axis relatively with respect to the first shaft portion; and
   a motor provided at the one arm or the another arm to rotate the second shaft portion relatively with respect to the first shaft portion around the shaft axis.

2. The transfer robot according to claim 1, wherein the main body is installed on a floor surface.

3. The transfer robot according to claim 1, wherein the one arm is connected to the main body via a rotatable shaft.

4. The transfer robot according to claim 3, wherein the rotatable shaft is movable along a rotation axis of the rotatable shaft with respect to the main body.

5. The transfer robot according to claim 1, wherein the first axis is substantially parallel to the shaft axis.

6. The transfer robot according to claim 1, wherein the motor is provided at the one arm and the motor comprises
   a rotor connected to the second shaft portion rotatably around the shaft axis; and
   a stator connected to the first shaft portion.

7. The transfer robot according to claim 1, further comprising:
   a brake provided at the another arm to apply a force so as to suppress relative rotation between the one arm and the another arm when electric power is not supplied to the motor.

8. The transfer robot according to claim 1, further comprising:
   a plurality of hands rotatably connected to the another arm via a second shaft.

9. The transfer robot according to claim 8,
   wherein the another arm comprises a plurality of rotary motors and a plurality of belts therein, and
   wherein driving force of each of the plurality of rotary motors is transmitted to each of the plurality of hands via each of the plurality of belts.

10. The transfer robot according to claim 9,
   wherein the plurality of hands includes a first hand and a second hand,
   wherein the plurality of rotary motors includes a first rotary motor and a second rotary motor, the first rotary motor having a first output shaft projecting in a first direction, the second rotary motor having a second output shaft projecting in a second direction opposite to the first direction, and
   wherein the plurality of belts includes a first belt and a second belt which are arranged such that at least a portion of the first belt and the second belt is nested when viewed along the first direction.

11. The transfer robot according to claim 1, wherein
   the one arm has a first connection portion,
   the another arm has a second connection portion that is connected to the first connection portion of the one arm via the shaft,
   the motor is provided at the first connection portion of the one arm and comprises
      a rotor rotatable around the shaft axis to rotate the another arm around the shaft axis, and
      a stator connected to the first connection portion of the one arm,
   the first connection portion of the one arm projects toward the another arm and has a thickness larger than a thickness of a portion other than the first connection portion of the one arm, and
   the another arm has another portion which projects toward the one arm and which has a thickness larger than a thickness of the second connection portion of the another arm.

12. The transfer robot according to claim 11, further comprising:
   a plurality of hands rotatably connected to the another arm via a second shaft,
   wherein the another arm comprises a plurality of rotary motors and a plurality of belts therein, and driving force of each of the plurality of rotary motors is transmitted to each of the plurality of hands via each of the plurality of belts, and
   wherein the plurality of rotary motors and the plurality of belts are arranged in the another portion of the another arm.

13. The transfer robot according to claim 9, wherein
   the motor comprises
      a rotor connected to the second shaft portion rotatably around the shaft axis, and
      a stator connected to the first shaft portion and having a through hole extending along the shaft axis, and
   a cable for each of the plurality of rotary motors is provided inside the one arm and inside the another arm via the through hole and an opening provided on a lower surface side of the one arm.

14. The transfer robot according to claim 13, further comprising:
   a removable cover closing the through hole and the opening.

15. The transfer robot according to claim 4, wherein the rotatable shaft comprises a built-in motor therein to rotate the one arm.

16. The transfer robot according to claim 6, wherein
   the stator has a cylindrical shape,
   the rotor faces an inner peripheral side of the stator, and
   the motor further comprises a base that supports the rotor.

17. The transfer robot according to claim 16, wherein the base comprises the bearing that rotatably supports the rotor.

18. The transfer robot according to claim 17, wherein the bearing is disposed in a hollow region of the stator.

19. A robot system comprising:
the transfer robot according to claim 1; and
control circuitry configured to control the transfer robot.

20. The transfer robot according to claim 1, wherein an entirety of the motor is provided inside the one arm.

21. The transfer robot according to claim 1, further comprising:
a hand connected to the another arm.

22. The transfer robot according to claim 1,
wherein the one arm has an upper surface and the another arm has a lower surface, the upper surface being opposite to the lower surface when the one arm and the another arm overlap, and
wherein the shaft axis is substantially perpendicular to the upper surface and the lower surface.

23. The transfer robot according to claim 7, wherein the brake is configured not to suppress the relative rotation when electric power is supplied to the motor.

24. The transfer robot according to claim 7, wherein the brake is provided inside the another arm.

25. The transfer robot according to claim 7, wherein the motor comprises
a rotor connected to the second shaft portion rotatably around the shaft axis,
a stator connected to the first shaft portion, and
the brake comprises a friction band wound around an outer periphery of a shaft portion which has an axis coaxial with the shaft axis and which is connected to the stator.

26. The transfer robot according to claim 7, wherein the motor comprises
a rotor connected to the second shaft portion rotatably around the shaft axis,
a stator connected to the first shaft portion, and
the brake is configured to apply a frictional force to the stator.

27. The transfer robot according to claim 6, wherein the stator is provided to surround the rotor.

28. The transfer robot according to claim 1, wherein the motor is provided at the another arm and the motor comprises
a rotor connected to the first shaft portion rotatably around the shaft axis; and
a stator connected to the second shaft portion.

29. The transfer robot according to claim 1, wherein an entirety of the motor is provided inside the another arm.

* * * * *